United States Patent
Ho et al.

(10) Patent No.: US 11,038,077 B2
(45) Date of Patent: Jun. 15, 2021

(54) CHIP PACKAGE AND MANUFACTURING METHOD THEREOF

(71) Applicant: XINTEC INC., Taoyuan (TW)

(72) Inventors: Yen-Shih Ho, Kaohsiung (TW); Po-Han Lee, Taipei (TW); Chien-Min Lin, Taoyuan (TW); Yi-Rong Ho, Taipei (TW)

(73) Assignee: XINTEC INC., Taoyuan (TW)

( * ) Notice: Subject to any disclaimer, the term of this patent is extended or adjusted under 35 U.S.C. 154(b) by 38 days.

(21) Appl. No.: 16/291,637

(22) Filed: Mar. 4, 2019

(65) Prior Publication Data

US 2019/0273175 A1 Sep. 5, 2019

Related U.S. Application Data

(60) Provisional application No. 62/638,769, filed on Mar. 5, 2018.

(51) Int. Cl.
*H01L 31/12* (2006.01)
*H01L 31/02* (2006.01)
*H01L 31/0203* (2014.01)
*H01L 31/0216* (2014.01)
*H01L 31/18* (2006.01)
*H01L 31/028* (2006.01)

(52) U.S. Cl.
CPC ........ *H01L 31/125* (2013.01); *H01L 31/0203* (2013.01); *H01L 31/02005* (2013.01); *H01L 31/028* (2013.01); *H01L 31/02164* (2013.01); *H01L 31/02165* (2013.01); *H01L 31/1804* (2013.01)

(58) Field of Classification Search
CPC ............... H01L 31/125; H01L 31/0203; H01L 31/02162; H01L 31/02164–02165
See application file for complete search history.

(56) References Cited

U.S. PATENT DOCUMENTS

| | | | |
|---|---|---|---|
| 8,227,927 B2 * | 7/2012 | Chen | H01L 25/0655 257/797 |
| 8,742,431 B2 * | 6/2014 | Shih | H01L 31/125 257/80 |
| 8,969,842 B2 * | 3/2015 | Minamikawa | H01L 25/167 250/551 |
| 9,905,722 B1 * | 2/2018 | Chen | G01S 17/04 |

(Continued)

FOREIGN PATENT DOCUMENTS

TW 201537721 10/2015

*Primary Examiner* — Maliheh Malek
(74) *Attorney, Agent, or Firm* — Liu & Liu

(57) ABSTRACT

A chip package includes a chip, a sidewall structure that has a first light-shielding layer, a second light-shielding layer, and a cover. The chip has a light emitter and a light receiver that are located on a top surface of the chip. The sidewall structure is located on the top surface of the chip and has two aperture areas. The light emitter and the light receiver are respectively located in the two aperture areas. The sidewall structure surrounds the light emitter and the light receiver, and at least one surface of the sidewall structure has the first light-shielding layer. The second light-shielding layer is located between the chip and the sidewall structure. The cover is located on a surface of the sidewall structure facing away from the chip, and at least covers the light receiver and the sidewall structure that surrounds the light receiver.

20 Claims, 10 Drawing Sheets

(56) References Cited

U.S. PATENT DOCUMENTS

| | | | | |
|---|---|---|---|---|
| 10,475,937 B1* | 11/2019 | Jones | | H01L 31/125 |
| 2004/0081409 A1* | 4/2004 | Ho | | H01L 31/125 |
| | | | | 385/92 |
| 2004/0104387 A1* | 6/2004 | Mogamiya | | H01L 27/14618 |
| | | | | 257/40 |
| 2005/0286840 A1* | 12/2005 | Ho | | G02B 6/4246 |
| | | | | 385/92 |
| 2010/0327164 A1* | 12/2010 | Costello | | H01L 24/97 |
| | | | | 250/338.1 |
| 2011/0057129 A1* | 3/2011 | Yao | | G01S 17/48 |
| | | | | 250/552 |
| 2011/0086676 A1* | 4/2011 | Choi | | G01S 17/04 |
| | | | | 455/567 |
| 2011/0204233 A1* | 8/2011 | Costello | | H03K 17/941 |
| | | | | 250/338.4 |
| 2012/0133956 A1* | 5/2012 | Findlay | | H01L 31/125 |
| | | | | 356/614 |
| 2012/0248625 A1* | 10/2012 | Coffy | | H01L 31/167 |
| | | | | 257/774 |
| 2013/0037702 A1* | 2/2013 | Minamikawa | | H01L 25/167 |
| | | | | 250/221 |
| 2014/0268344 A1* | 9/2014 | Arakawa | | G01J 3/26 |
| | | | | 359/580 |
| 2016/0216138 A1* | 7/2016 | Rudmann | | H01L 27/14625 |
| 2016/0216777 A1* | 7/2016 | Geiger | | G01D 5/34 |
| 2016/0238439 A1* | 8/2016 | Chu | | H01L 31/02327 |
| 2016/0291265 A1* | 10/2016 | Kinghorn | | G02B 6/131 |
| 2016/0306042 A1* | 10/2016 | Schrank | | H01L 31/02164 |
| 2017/0053903 A1* | 2/2017 | Nishimura | | H01L 33/56 |
| 2017/0125613 A1* | 5/2017 | Minixhofer | | H01L 31/167 |
| 2018/0062003 A1* | 3/2018 | Luan | | H01L 31/125 |
| 2018/0364869 A1* | 12/2018 | Lee | | G06F 3/0421 |
| 2019/0041909 A1* | 2/2019 | Pakula | | G06F 1/26 |
| 2019/0110697 A1* | 4/2019 | Oode | | A61B 5/0261 |
| 2019/0285922 A1* | 9/2019 | Sun | | H01L 27/3244 |

* cited by examiner

CHIP PACKAGE AND MANUFACTURING METHOD THEREOF

RELATED APPLICATIONS

This application claims priority to U.S. Provisional Application Ser. No. 62/638,769, filed Mar. 5, 2018, which is herein incorporated by reference.

BACKGROUND

Field of Invention

The present invention relates to a chip package and a manufacturing method of the chip package.

Description of Related Art

In general, a vertical-cavity surface-emitting laser (VCSEL) is manufactured by using a traditional dual in-line package (DIP) with a metal cap, in which the metal cap is used for light shielding to ensure that a laser is emitted only in a vertical direction. However, since a light emitter and a light receiver of a device that has the vertical-cavity surface-emitting laser are difficult to be integrated in a single package, the volume of the device is difficult to be reduced. Furthermore, if the metal cap is adhered to the device by an adhesive, a laser may pass through the adhesive and irradiate outward in an unexpected direction.

SUMMARY

An aspect of the present invention is to provide a chip package.

According to an embodiment of the present invention, a chip package includes a chip, a sidewall structure that has a first light-shielding layer, a second light-shielding layer, and a cover. The chip has a light emitter and a light receiver, in which the light emitter and the light receiver are located on a top surface of the chip. The sidewall structure is located on the top surface of the chip and having two aperture areas, in which the light emitter and the light receiver are located respectively in the two aperture areas, and the sidewall structure surrounds the light emitter and the light receiver, and at least one surface of the sidewall structure has the first light-shielding layer. The second light-shielding layer is located between the chip and the sidewall structure, and the cover is located on the sidewall structure facing away from the chip, and at least covering the light receiver and the sidewall structure that surrounds the light receiver.

An aspect of the present invention is to provide a manufacturing method of a chip package.

According to an embodiment of the present invention, a manufacturing method of a chip package includes the following steps of: forming two concave portions in one side of a lid, in which the lid is made of a material including silicon, and the side of the lid has a sidewall structure that surrounds the two concave portions; forming a first light-shielding layer covering at least one surface of the side of the lid; forming a second light-shielding layer on the sidewall structure; bonding the sidewall structure to a chip, in which the second light-shielding layer is located between the chip and the sidewall structure; grinding a surface of the lid facing away from the chip such that the sidewall structure is exposed to form two aperture areas, in which a light emitter and a light receiver on a top surface of the chip are respectively located in the two aperture areas; and disposing a cover at least covering the light receiver and the sidewall structure that surrounds the light receiver.

In the aforementioned embodiments of the present invention, since the sidewall structure of the chip package has the first light-shielding layer, and the light emitter and the light receiver are respectively located in the two aperture areas of the sidewall structure, when the light emitter emits a light, the light can be ensured to irradiate outward in a vertical direction without passing through the sidewall structure and being received by the light receiver to cause interference. Furthermore, a tangled external light (i.e., a non-vertical light) can also be blocked by the first light-shielding layer of the sidewall structure to avoid being received by the light receiver and cause interference. In addition, the second light-shielding layer is located between the chip and the sidewall structure and can replace a traditional adhesive. The second light-shielding layer not only can bond the chip to the sidewall structure, but also prevent the light of the light emitter from being transmitted laterally to the light receiver, thereby avoiding interference to the light receiver. Moreover, the cover that covers the light receiver may ensure that the light receiver does not receive an infrared entering from a direction of a target object, thereby avoiding interference. The light emitter, the light receiver, the sidewall structure and the cover are integrated into a single chip package, thereby facilitating a reduction in volume.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
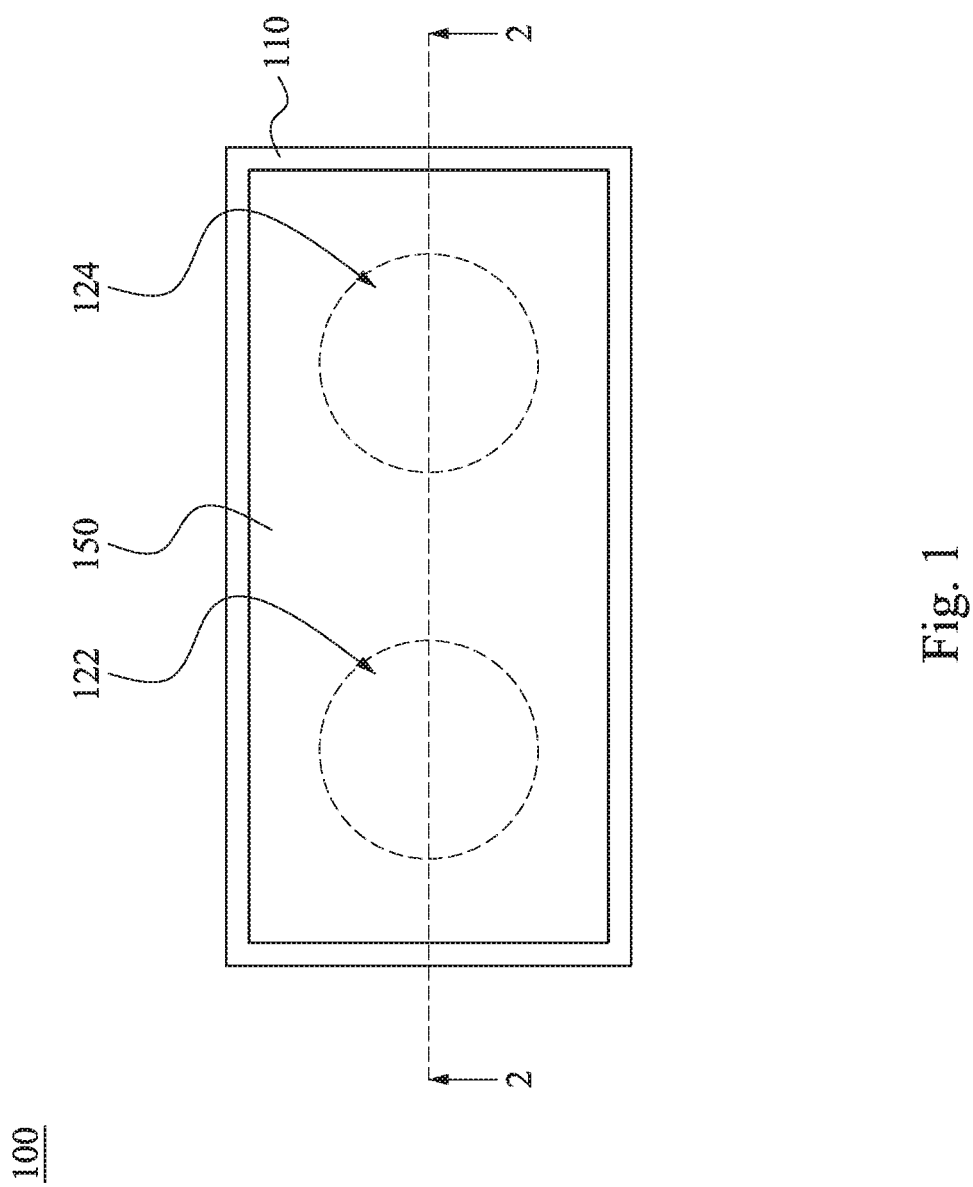
FIG. 1 is a top view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
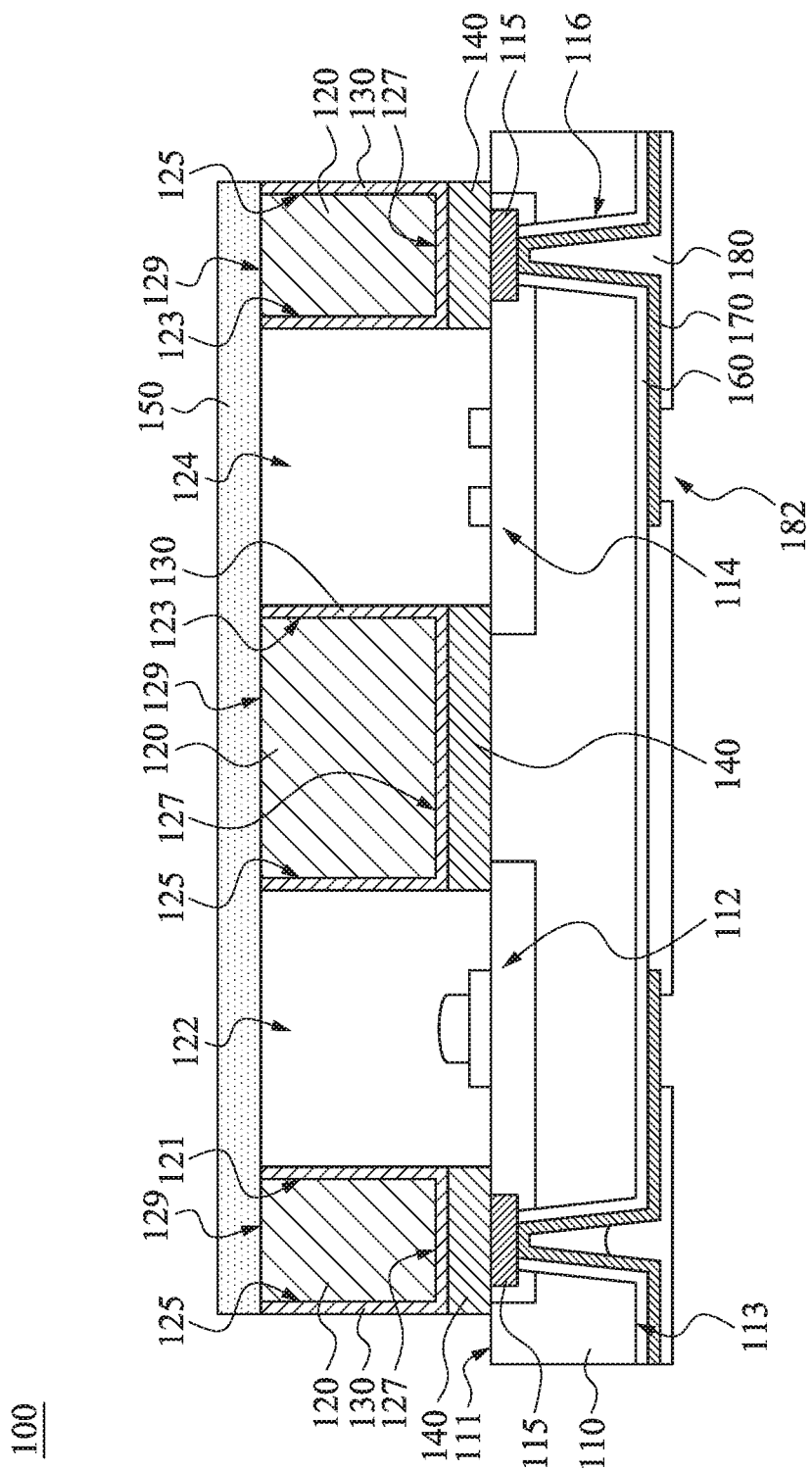
FIG. 2 is a cross-sectional view of the chip package taken along line 2-2 shown in FIG. 1.

FIG. 1 is a top view of a chip package 100 according to one embodiment of the present invention. FIG. 2 is a cross-sectional view of the chip package 100 taken along line 2-2 shown in FIG. 1. As shown in FIG. 1 and FIG. 2, the chip package 100 includes a chip 110, a sidewall structure 120 that has a first light-shielding layer 130, a second light-shielding layer 140, and a cover 150. The chip 110 has a light emitter 112 and a light receiver 114. The light emitter 112 and the light receiver 114 are located on a top surface 111 of the chip 110. The sidewall structure 120 is located on the top surface 111 of the chip 110, and has two aperture areas 122 and 124. The light emitter 112 is located in the aperture area 122, and the light receiver 114 is located in the aperture area 124. The sidewall structure 120 surrounds the light emitter 112 and the light receiver 114, and at least one surface of the sidewall structure 120 has the first light-shielding layer 130. For example, the first light-shielding layer 130 is located on surfaces 121, 123, 125, and 127, in which the surface 121 of the sidewall structure 120 faces toward the aperture area 122, and the surface 123 of the sidewall structure 120 faces toward the aperture area 124, and the surface 125 of the sidewall structure 120 faces outward away from the aperture area 124, and the surface 127 of the sidewall structure 120 faces toward the top surface 111 of the chip 110. The second light-shielding layer 140 is located between the chip 110 and the sidewall structure 120. The cover 150 is located on the surface 129 of the sidewall structure 120 facing away from the chip 110, and at least covers the light receiver 114 and the sidewall structure 120 that surrounds the light receiver 114.

In this embodiment, the chip 110 and the sidewall structure 120 may be made of a material including silicon. The first light-shielding layer 130 may be made of a material including aluminum or titanium. The second light-shielding layer 140 may be a black photoresist having adhesion. The cover 150 can be an infrared cut-off glass, such as a surface of a glass coated with an infrared cut-off layer. Furthermore, the chip package 100 can be used as a vertical cavity surface emitting laser (VCSEL) device. The light emitter 112 can emit infrared, but the present invention is not limited in this regard.

Since the sidewall structure 120 of the chip package 100 has the first light-shielding layer 130, and the light emitter 112 and the light receiver 114 are respectively located in the two aperture areas 122 and 124, when the light emitter 112 emits a light, the light can be ensured to irradiate outward in a vertical direction (such as upward) without passing through the sidewall structure 120 and being received by the light receiver 114 to cause interference. Furthermore, a tangled external light (i.e., a non-vertical light) can also be blocked by the first light-shielding layer 130 of the sidewall structure 120 to avoid being received by the light receiver 114 and cause interference. In addition, the second light-shielding layer 140 is located between the chip 110 and the sidewall structure 120, and can replace a traditional adhesive. The second light-shielding layer 140 not only can bond the chip 110 to the sidewall structure 120, but also prevent the light of the light emitter 112 from being transmitted laterally to the light receiver 114, thereby avoiding interference to the light receiver 114. Moreover, the cover 150 that covers the light receiver 114 can ensure that the light receiver 114 does not receive an infrared entering from a direction of a target object (such as an infrared entering from a directly above direction), thereby avoiding interference. The light emitter 112, the light receiver 114, the sidewall structure 120 and the cover 150 are integrated into the single chip package 100, thereby facilitating a reduction in volume.

In this embodiment, the cover 150 further covers the light emitter 112 and the sidewall structure 120 that surrounds the light emitter 112, in which the sidewall structure 120 is located between the cover 150 and the chip 110. The cover 150 can prevent dust or moisture from entering the aperture area 122 to protect the light emitter 112.

Furthermore, the chip 110 includes at least one conductive pad 115, in which the conductive pad 115 is located on the top surface 111 of the chip 110, and the sidewall structure 120 and the second light-shielding layer 140 cover the conductive pad 115. In other words, the sidewall structure 120 and the second light-shielding layer 140 are substantially aligned with the conductive pad 115, and overlap the conductive pad 115.

In this embodiment, a bottom surface 113 of the chip 110 facing away from the top surface 111 has a through hole 116, in which the conductive pad 115 is located in the through hole 116. The chip package 110 further includes an isolation layer 160, a redistribution layer 170, and a passivation layer 180. The isolation layer 160 is located on the bottom surface 113 of the chip 110 and on a sidewall that surrounds the through hole 116. The redistribution layer 170 is located on the isolation layer 160 and the conductive pad 115 that is in the through hole 116. The passivation layer 180 is located on the isolation layer 160 and the redistribution layer 170, in which the passivation layer 180 on the bottom surface 113 has an opening 182, and a portion of the redistribution layer 170 is located in the opening 182 of the passivation layer 180. The redistribution layer 170 of the chip package 100 can be exposed through the opening 182 of the passivation layer 180, and can be electrically connected to a conductive structure of an external electronic component (such as a printed circuit board). Such a design is a land grid array (LGA).

It is to be noted that the connection relationships, the materials, and the advantages of the elements described above will not be repeated. In the following description, other types of chip packages will be described.

Figure 3:
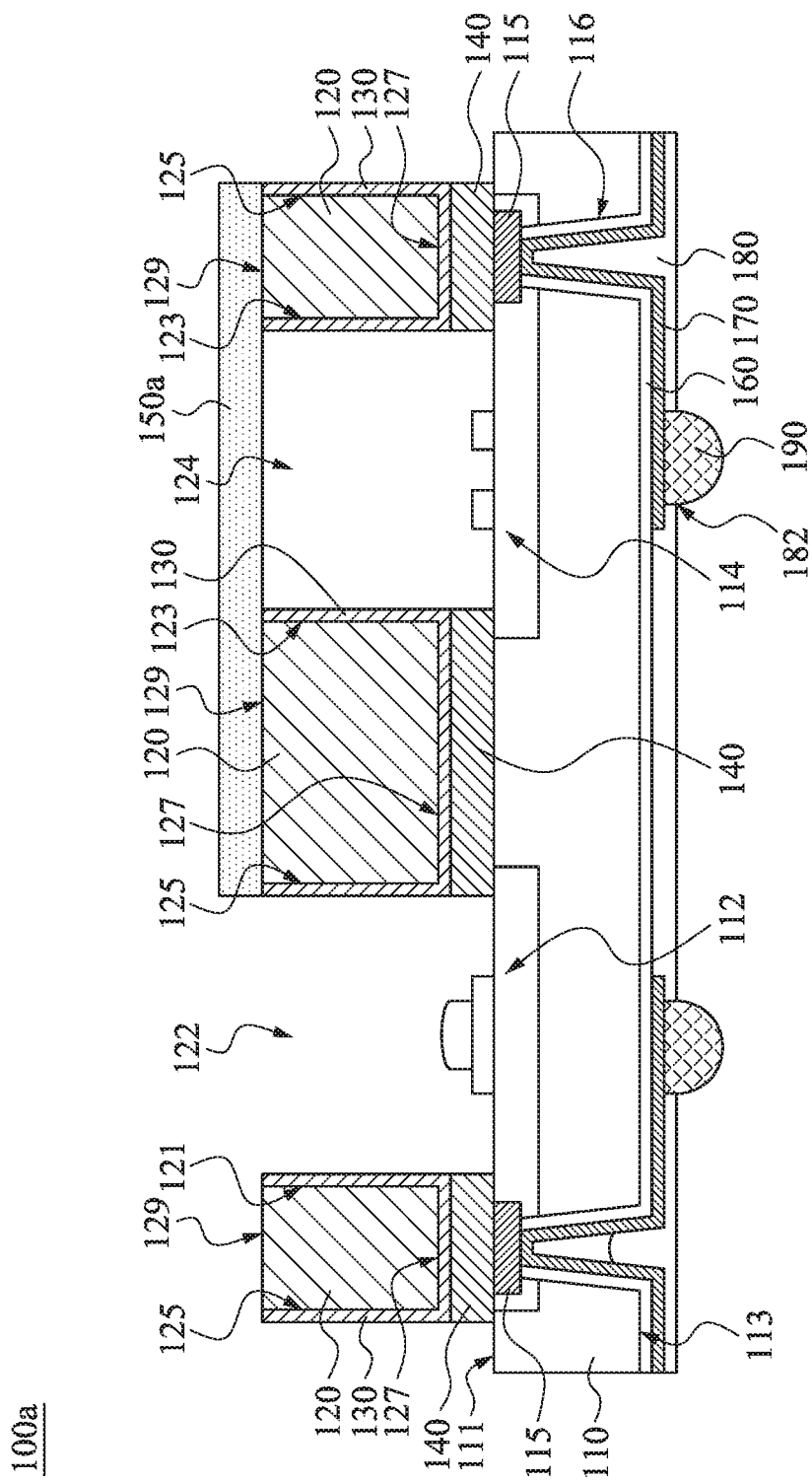
FIG. 3 is a cross-sectional view of a chip package according to one embodiment of the present invention.

FIG. 3 is a cross-sectional view of a chip package 100a according to one embodiment of the present invention. As shown in FIG. 3, the chip package 100a includes the chip 100, the sidewall structure 120 that has the first light-shielding layer 130, the second light-shielding layer 140 and a cover 150a. The difference between this embodiment and the embodiment of FIG. 2 is that the cover 150a covers only the light receiver 114 and the sidewall structure 120 that surrounds the light receiver 114, but does not extend to a position above the light emitter 112, and thus the material cost of the cover 150a can be saved. Furthermore, in this embodiment, the chip package 100a further includes a conductive structure 190, in which the conductive structure 190 is located on the redistribution layer 170 in the opening 182 of the passivation layer 180. The conductive structure 190 can be used to electrically connect to a conductive junction of an external electronic component (such as a printed circuit board), and such a design is a ball grid array (BGA).

In the following description, a manufacturing method of the chip package 100 of FIG. 2 will be described.

Figure 4:
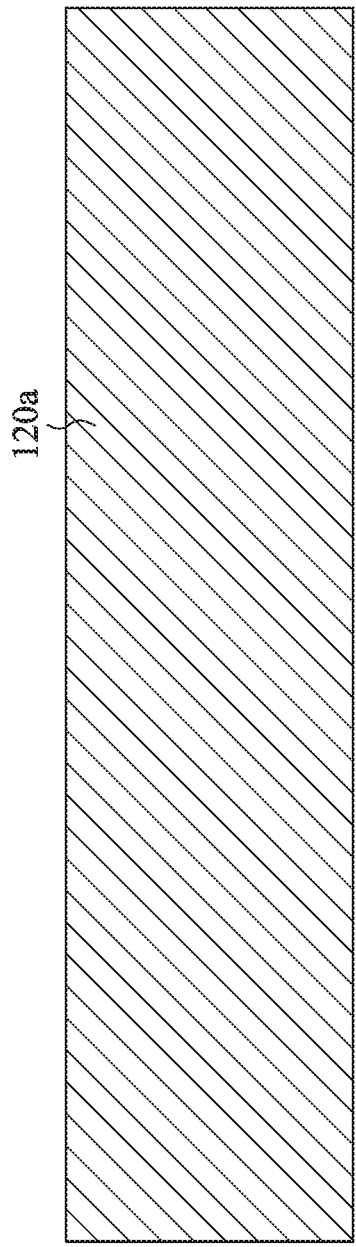
FIG. 4 to FIG. 10 are cross-sectional views at various stages of a manufacturing method of a chip package.
Figure 5:
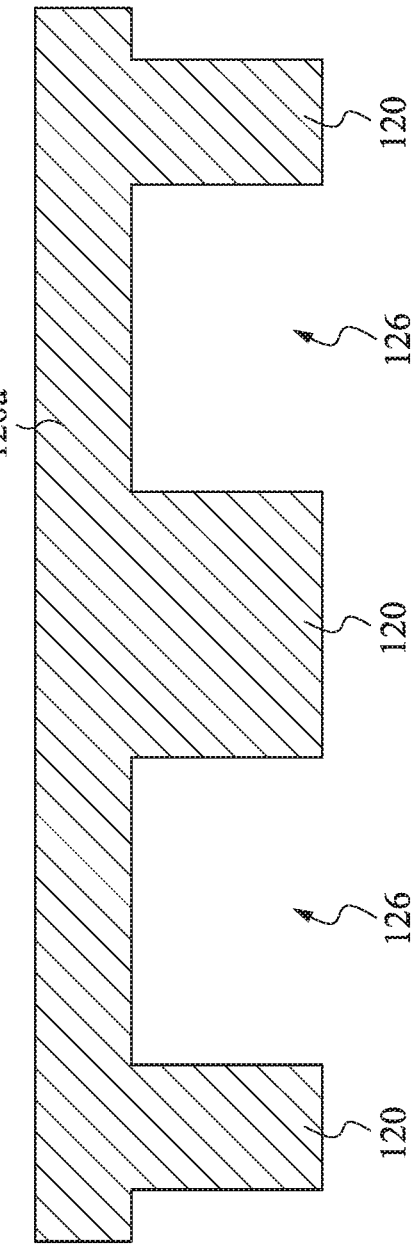

FIG. 4 to FIG. 10 are cross-sectional views at various stages of a manufacturing method of the chip package 100 according to one embodiment of the present invention. As shown in FIG. 4 and FIG. 5, first of all, two concave portions 126 are formed in one side of a lid 120a (such as a lower side). The lid 120a is made of a material including silicon, and the concave portions 126 may be made by a patterning process such that the lower side of the lid 120a has the sidewall structure 120 that surrounds the two concave portions 126. The patterning process may be a photolithography technology including exposure, lithography, and etching processes, but the present invention is not limited in this regard.

Figure 6:
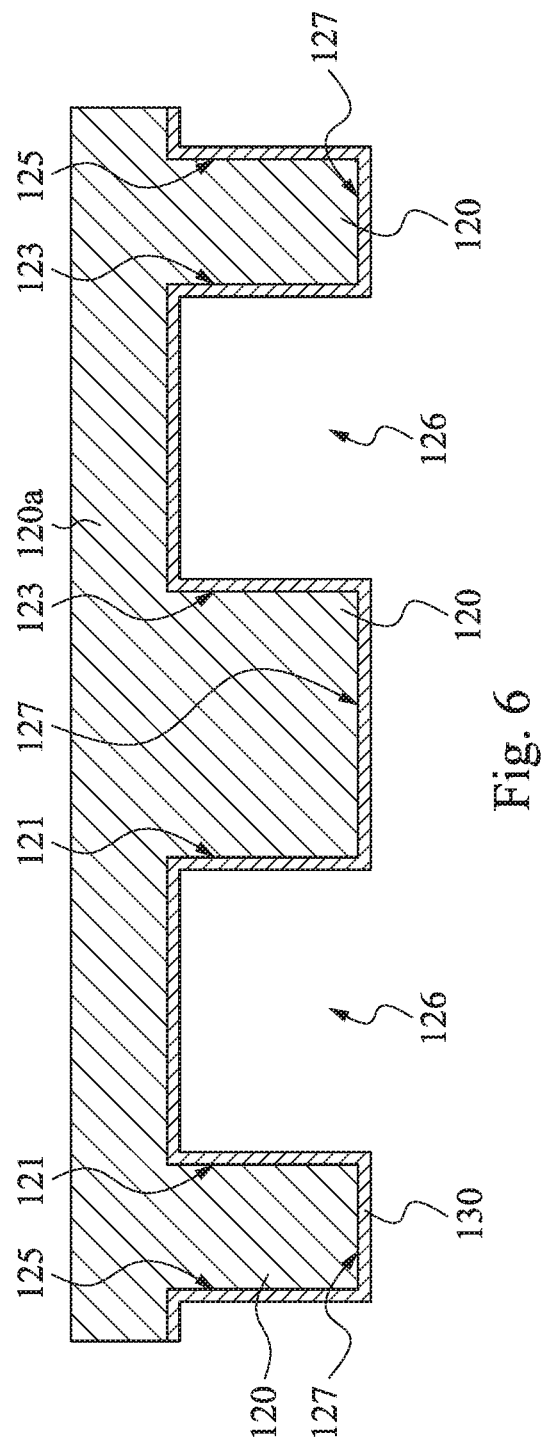

As shown in FIG. 6, after forming the concave portions 126 of the lid 120a, the first light-shielding layer 130 which covers a surface of the lower side of the lid 120a can be formed, for example, the first light-shielding layer 130 covers the surface 121, 123, 125, and 127 of the lid 120a. The first light-shielding layer 130 may be formed by sputtering, but the present invention is not limited in this regard.

Figure 7:
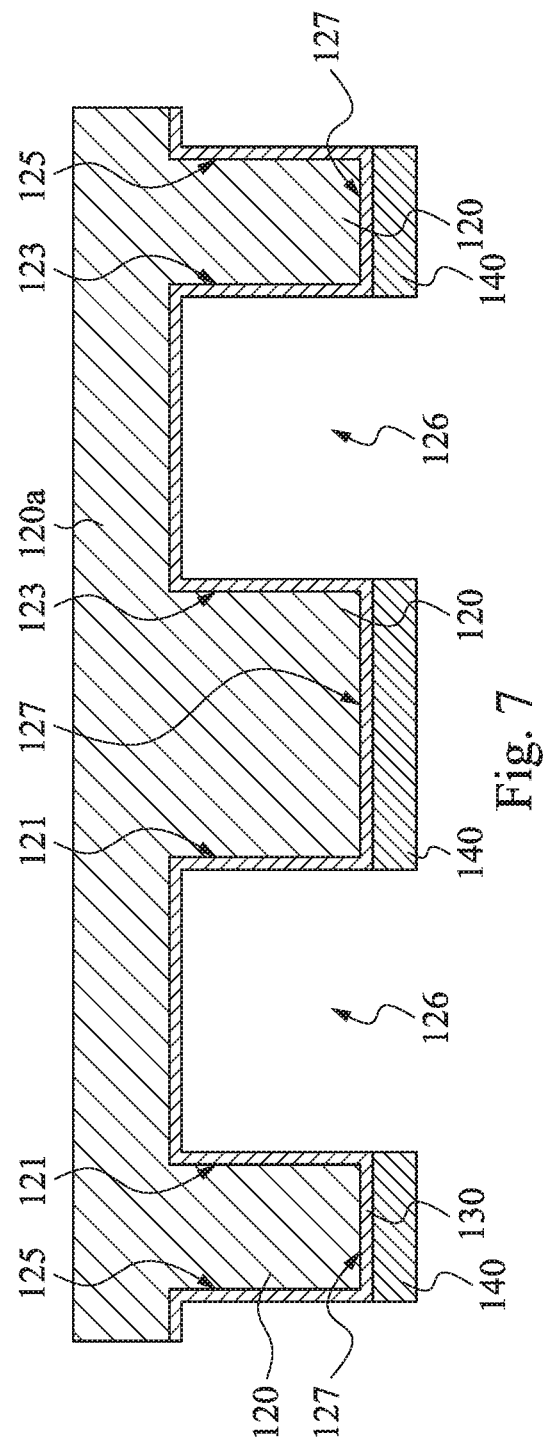

As shown in FIG. 7, after forming the first light-shielding layer 130, the second light-shielding layer 140 can be formed on the sidewall structure 120 such that a portion of the first light-shielding layer 130 is located between the second light-shielding layer 140 and the surface 127 of the sidewall structure 120. The second light-shielding layer 140 may be formed by coating, but the present invention is not limited in this regard.

Figure 8:
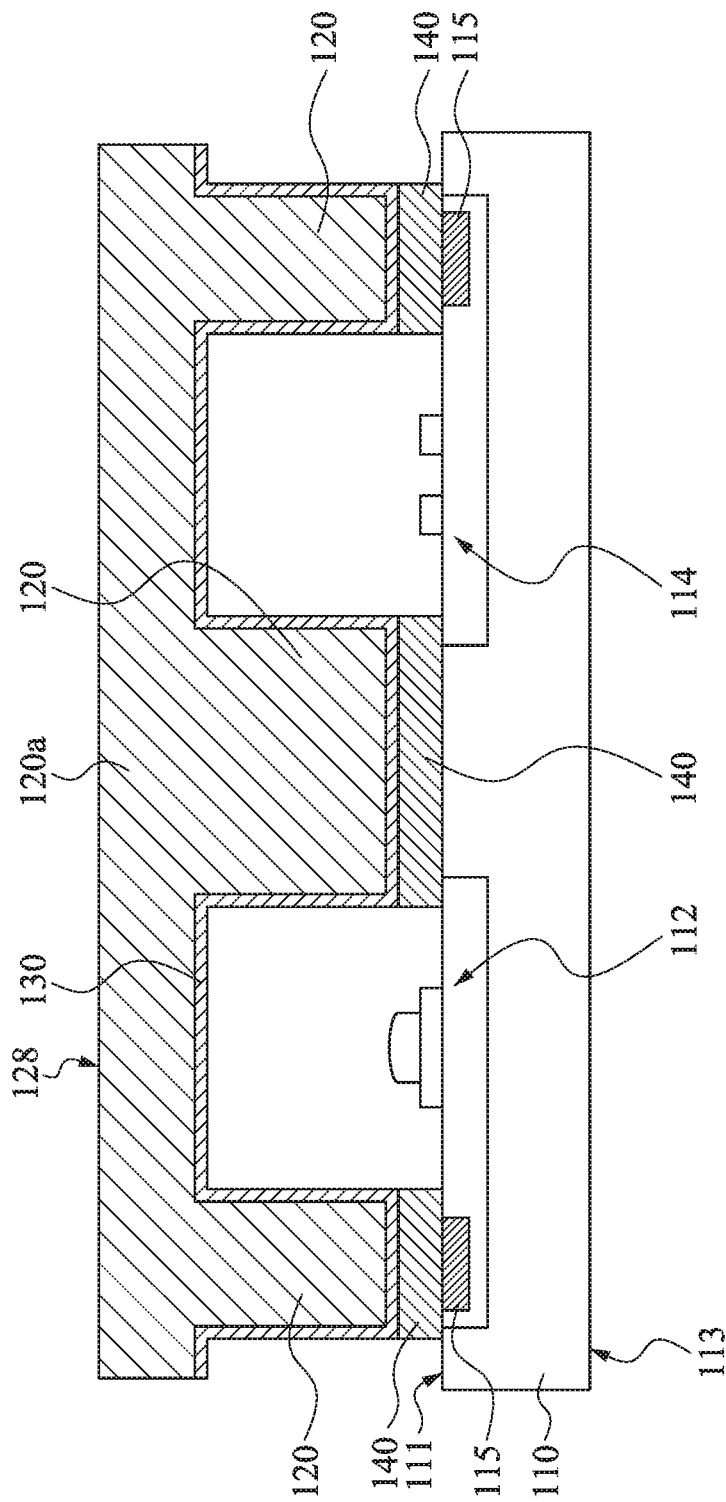

As shown in FIG. 8, the second light-shielding layer 140 is adhesive, so that the sidewall structure 120 of the lid 120a can be bonded to the chip 110 such that the second light-shielding layer 140 is located between the chip 110 and the sidewall structure 120. In this step, the sidewall structure 120 and the second light-shielding layer 140 cover the conductive pad 115 of the chip 110.

Figure 9:
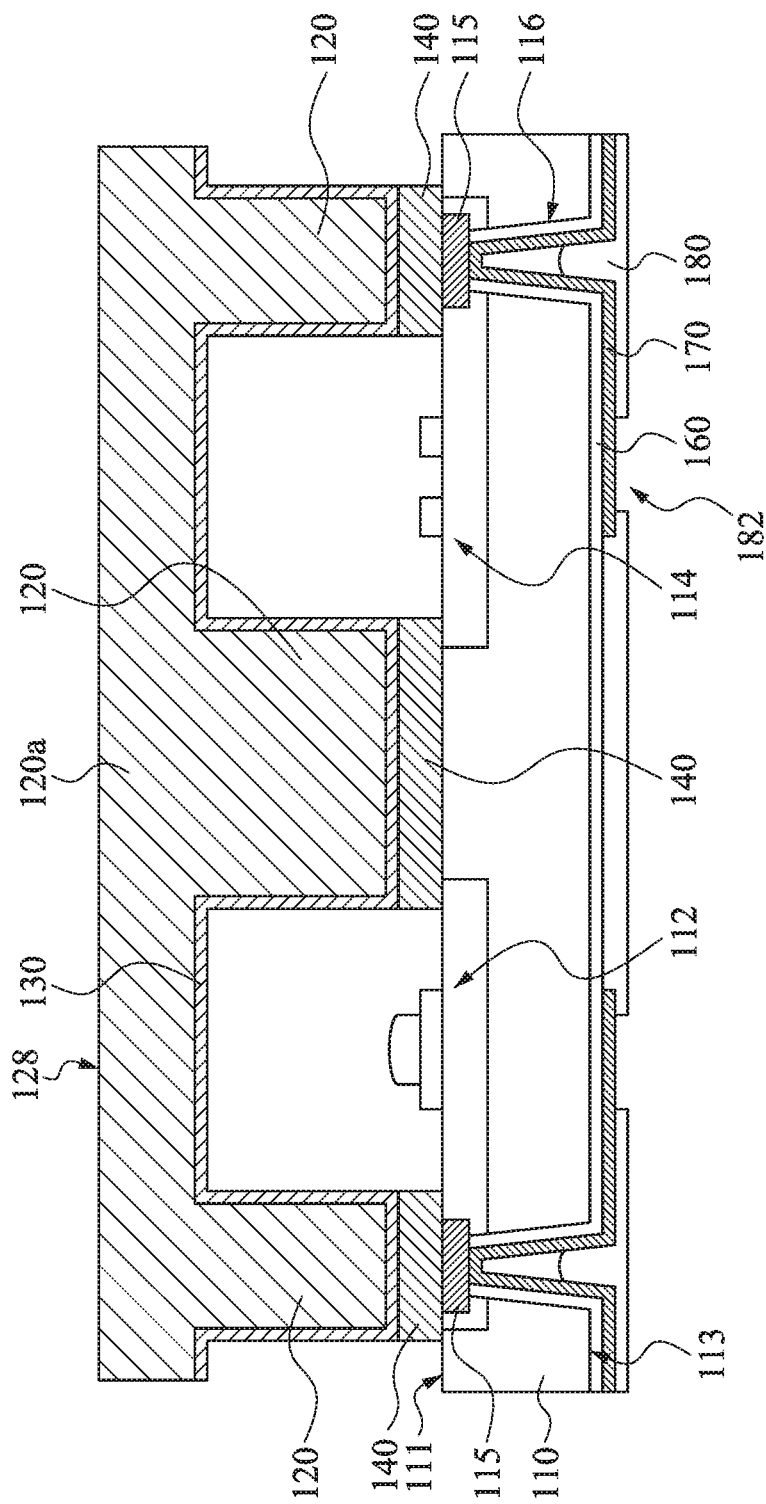

As shown in FIG. 9, after bonding the lid 120a to the chip 110, the chip 110 can be patterned, such that the through hole 116 is formed in the bottom surface 113 of the chip 110 facing away from the top surface 111, and the conductive pad 115 in the through hole 116 is exposed. Thereafter, the isolation layer 160 can be formed on the bottom surface 113 of the chip 110, the sidewall that surrounds the through hole 116, and the conductive pad 115 by chemical vapor deposition (CVD), and an etching process is performed on the isolation layer 160 to remove the isolation layer 160 on the conductive pad 115. Afterwards, the redistribution layer 170 can be formed on the isolation layer 160 and the conductive pad 115 that is in the through hole 116. Therefore, the redistribution layer 170 is electrically connected to the conductive pad 115. After that, the passivation layer 180 can be formed on the insolation layer 160 and the redistribution layer 170. Thereafter, the passivation layer 180 can be patterned to form the opening 182 such that a portion of the redistribution layer 170 is located in the opening 182 of the passivation layer 180. In addition, a conductive structure 190 (shown in FIG. 3) can be selectively formed on the redistribution layer 170 in the opening 182 as deemed necessary by designers.

Figure 10:
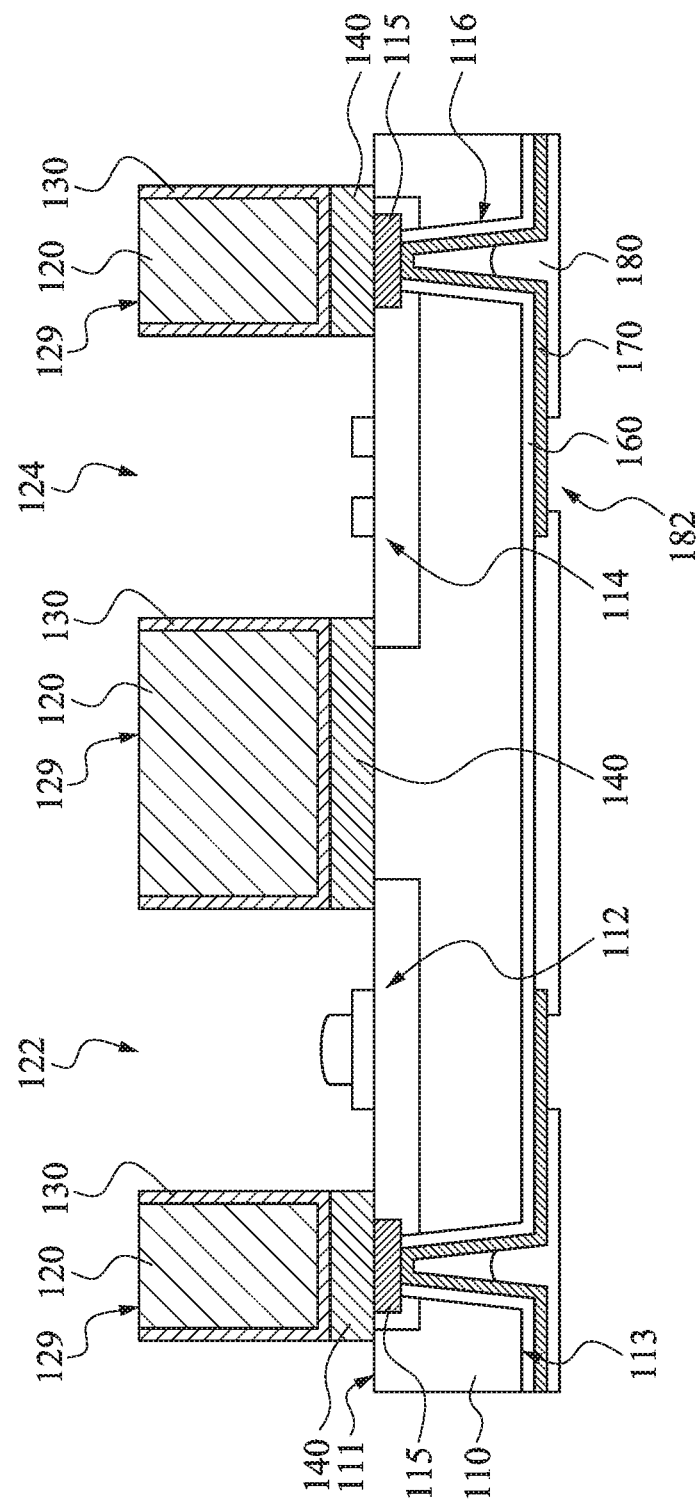

As shown in FIG. 9 and FIG. 10, after forming the passivation layer 180, a surface 128 of the lid 120a facing away from the chip 110 can be ground, so that the sidewall structure 120 is exposed to form the two aperture areas 122 and 124, as shown in FIG. 9. The light emitter 112 and the light receiver 114 on the top surface 111 of the chip 110 are respectively located in the aperture areas 122 and 124, and are exposed through the two aperture areas 122 and 124.

After forming the aperture areas 122 and 124, the cover 150 (shown in FIG. 2) can be disposed on the surface 129 of the sidewall structure 120, such that the cover 150 covers the light emitter 112, the light receiver 114, and the sidewall structure 120 that surrounds the light emitter 112 and the light receiver 114, and the sidewall structure 120 is located between the cover 150 and the chip 110, thereby obtaining the chip package 100 of FIG. 2. In another embodiment, the cover 150a (shown in FIG. 3) can be disposed to cover the light receiver 114 and the sidewall structure 120 that surrounds the light receiver 114, but not covering the light emitter 112 and the sidewall structure 120 that surrounds the light emitter 112, thereby obtaining the chip package 100a of FIG. 3.

Figure 11:
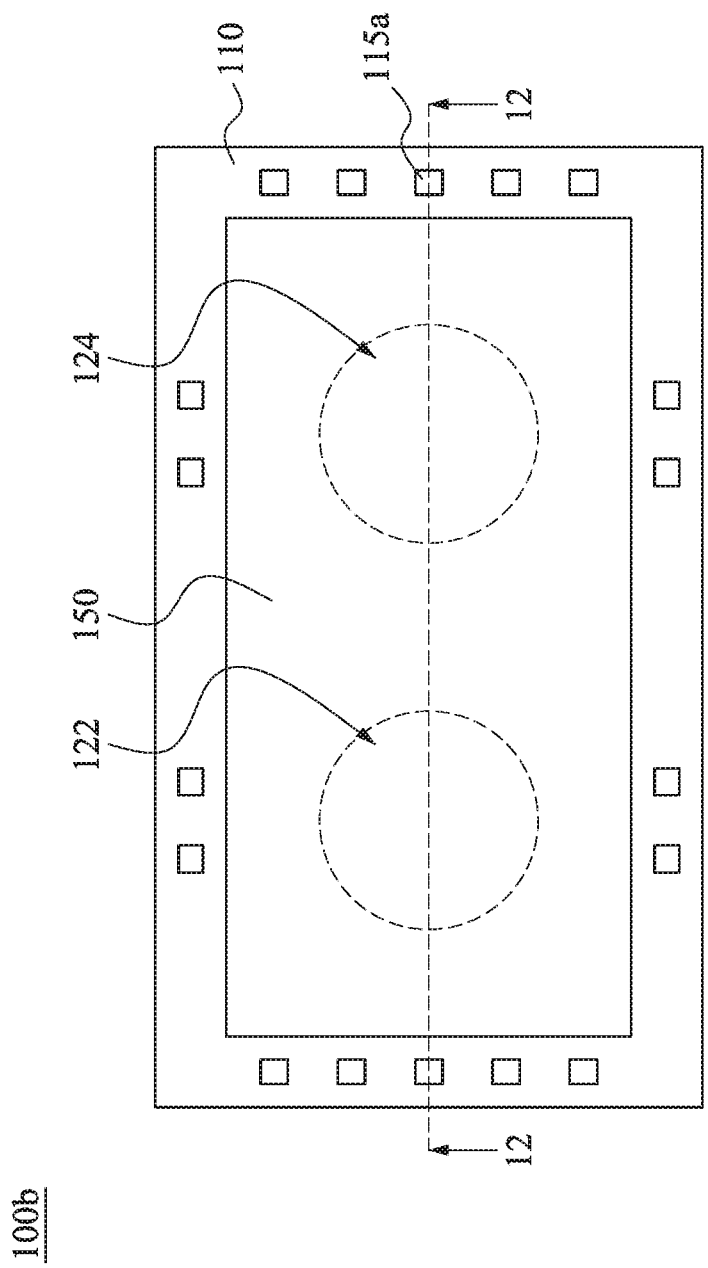
FIG. 11 is a top view of a chip package according to one embodiment of the present invention.
Figure 12:
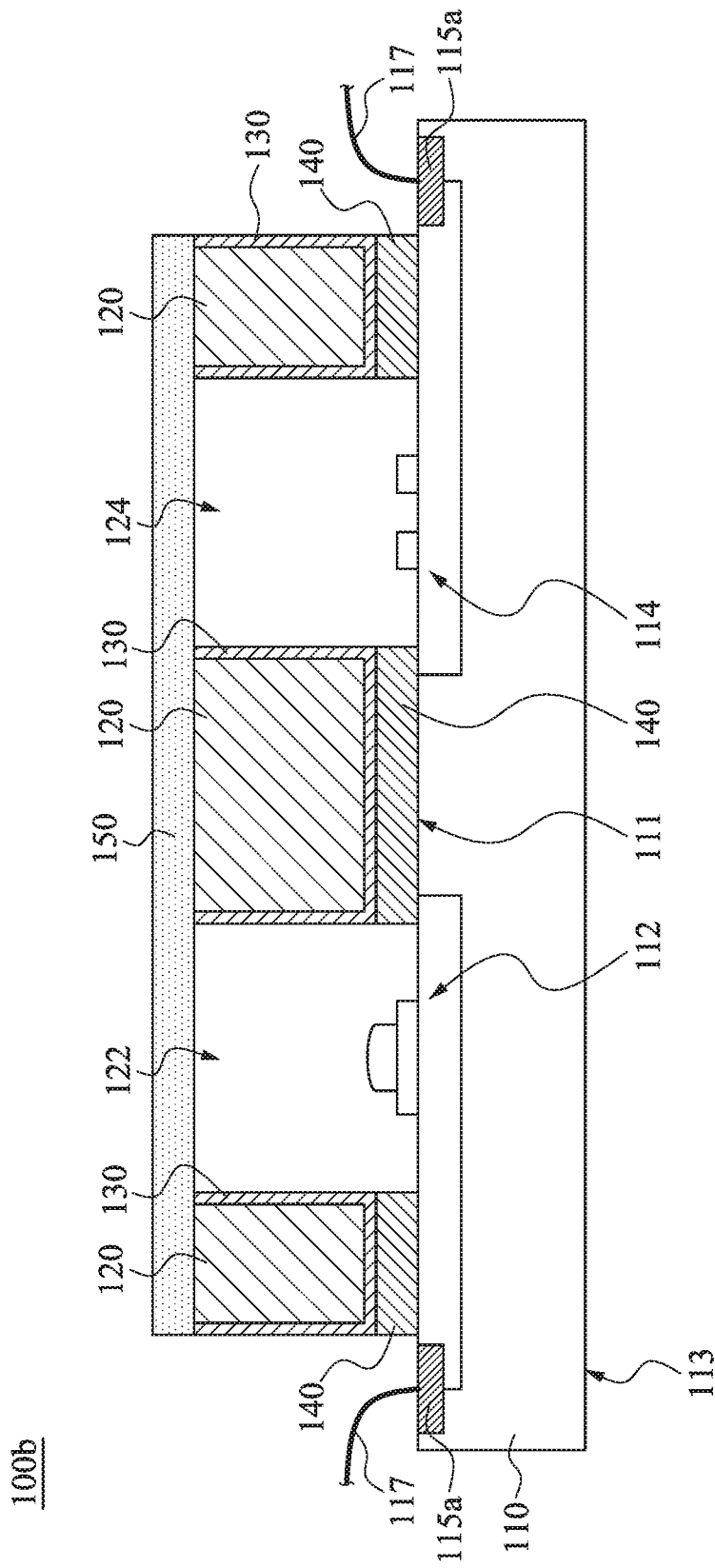
FIG. 12 is a cross-sectional view of the chip package taken along line 12-12 shown in FIG. 11.

FIG. 11 is a top view of a chip package 100b according to one embodiment of the present invention. FIG. 12 is a cross-sectional view of the chip package 100b taken along line 12-12 shown in FIG. 11. As shown in FIG. 11 and FIG. 12, the chip package 100b includes the chip 110, the sidewall structure 120 that has the first light-shielding layer 130, the second light-shielding layer 140, and the cover 150. The difference between this embodiment and the embodiment of FIG. 1 and FIG. 2 is that the chip 110 has a conductive pad 115a outside the sidewall structure 120 and the second light-shielding layer 140. That is, the second light-shielding layer 140 is located between the aperture area 122 and the conductive pad 115a, and is also located between the aperture area 124 and the conductive pad 115a.

In this embodiment, a conductive wire 117 can be bonded to the conductive pad 115a such that one end of the conductive wire 117 is electrically connected to the conductive pad 115a, and the other end of the conductive wire 117 is electrically connected to an external electronic component (such as a printed circuit board). Since the conductive pad 115a is not covered by the sidewall structure 120 and the second light-shielding layer 140, and can be bonded to the conductive wire 117, the bottom surface 113 of the chip 110 of the chip package 100b does not need to form the through hole 116, the isolation layer 160, the redistribution layer 170, the passivation layer 180 that are shown in FIG. 2 and the conductive structure 190 that is shown in FIG. 3.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising: a chip having a light emitter and a light receiver that are located on a top surface of the chip; a sidewall structure located on the top surface of the chip and having two aperture areas, wherein the light emitter and the light receiver are respectively located in the two aperture areas, and the sidewall structure surrounds the light emitter and the light receiver; a first light-shielding layer located on the bottom and side surfaces of the sidewall structure; a second light-shielding layer located only between the chip and the bottom surface of the sidewall structure, wherein the first light-shielding layer has a portion between a bottom surface of the sidewall structure and a top surface of the second light-shielding layer, and the sidewall structure and the second light-shielding layer cover at least one conductive pad; and a cover located on a surface of the sidewall structure facing away from the chip, and at least covering the light receiver and the sidewall structure that surrounds the light receiver.

2. The chip package of claim 1, wherein the sidewall structure is made of a material comprising silicon.

3. The chip package of claim 1, wherein the first light-shielding layer is made of a material comprising aluminum or titanium.

4. The chip package of claim 1, wherein the second light-shielding layer is a black photoresist.

5. The chip package of claim 1, wherein the cover further covers the light emitter and the sidewall structure that surrounds the light emitter, and the sidewall structure is located between the cover and the chip.

6. The chip package of claim 1, wherein the cover is an infrared cut-off glass.

7. The chip package of claim 1, wherein the conductive pad is located on the top surface of the chip.

8. The chip package of claim 7, wherein the sidewall structure and the second light-shielding layer are substantially aligned with the conductive pad.

9. The chip package of claim 7, wherein a bottom surface of the chip facing away from the top surface has a through hole, and the conductive pad is located in the through hole, and the chip package further comprises:
- an isolation layer located on the bottom surface of the chip and a sidewall that surrounds the through hole;
- a redistribution layer located on the isolation layer and the conductive pad that is in the through hole; and
- a passivation layer located on the isolation layer and the redistribution layer, wherein the passivation layer on the bottom surface has an opening, and a portion of the redistribution layer is located in the opening.

10. The chip package of claim 9, further comprising:
- a conductive structure located on the portion of the redistribution layer.

11. The chip package of claim 7, wherein the chip package can be used as a vertical cavity surface emitting laser (VCSEL) device.

12. The chip package of claim 11, further comprising:
- a conductive wire electrically connected to the conductive pad.

13. A manufacturing method of a chip package, comprising steps of: forming two concave portions in one side of a lid, wherein the lid is made of a material comprising silicon, and the side of the lid has a sidewall structure surrounding the two concave portions; forming a first light-shielding layer covering at least one surface of the side of the lid; forming a second light-shielding layer on the sidewall structure, wherein the first light-shielding layer has a portion between a bottom surface of the sidewall structure and a top surface of the second light-shielding layer; bonding the sidewall structure to a chip having a light emitter and a light receiver that are located on a top surface of the chip, wherein the second light-shielding layer is located between the chip and the sidewall structure covering at least one conductive pad of the chip; grinding a surface of the lid facing away from the chip, such that the sidewall structure is exposed to form two aperture areas, wherein the sidewall structure is located on the top surface of the chip and having the two aperture areas, wherein the light emitter and the light receiver are respectively located in the two aperture areas, wherein the light emitter and the light receiver on the top surface of the chip are respectively located in the two aperture areas, and wherein the sidewall structure surrounds the light emitter and the light receiver; and disposing a cover at least covering the light receiver and the sidewall structure that surrounds the light receiver.

14. The manufacturing method of the chip package of claim 13, wherein the cover further covers the light emitter and the sidewall structure that surrounds the light emitter, such that the sidewall structure is located between the cover and the chip.

15. The manufacturing method for the chip package of claim 13, wherein the step of bonding the sidewall structure to the chip further comprises: the sidewall structure and the second light-shielding layer are substantially aligned with the conductive pad.

16. The manufacturing method for the chip package of claim 15, further comprising:
- forming a through hole in a bottom surface of the chip facing away from the top surface, wherein the conductive pad is located in the through hole;
- forming an isolation layer on the bottom surface of the chip and a sidewall that surrounds the through hole;
- forming a redistribution layer on the isolation layer and the conductive pad that is in the through hole;
- forming a passivation layer on the isolation layer and the redistribution layer; and
- forming an opening in the passivation layer, wherein a portion of the redistribution layer is located in the opening.

17. The manufacturing method for the chip package of claim 16, further comprising:
- forming a conductive structure on the portion of the redistribution layer.

18. The manufacturing method for the chip package of claim 15, wherein the manufacturing method of the chip package further comprises: bonding a conductive wire to the conductive pad.

19. A chip package, comprising:
- a chip having a light emitter and a light receiver that are located on a top surface of the chip;
- a sidewall structure located on the top surface of the chip and having two aperture areas, wherein the light emitter and the light receiver are respectively located in the two aperture areas, and the sidewall structure surrounds the light emitter and the light receiver, and at least one surface of the sidewall structure has a first light-shielding layer;
- a second light-shielding layer located between the chip and the sidewall structure; and
- a cover located on a surface of the sidewall structure facing away from the chip, and at least covering the light receiver and the sidewall structure that surrounds the light receiver,
- wherein the chip comprises at least one conductive pad located on the top surface of the chip,
- wherein a bottom surface of the chip facing away from the top surface has a through hole, and the conductive pad is located in the through hole, and
- wherein the chip package further comprises:
  - an isolation layer located on the bottom surface of the chip and a sidewall that surrounds the through hole;
  - a redistribution layer located on the isolation layer and the conductive pad that is in the through hole; and
  - a passivation layer located on the isolation layer and the redistribution layer, wherein the passivation layer on the bottom surface has an opening, and a portion of the redistribution layer is located in the opening.

20. The chip package of claim 19, further comprising a conductive structure located on the portion of the redistribution layer.

* * * * *